United States Patent [19]

Murase et al.

[11] Patent Number: 4,982,407
[45] Date of Patent: Jan. 1, 1991

[54] SEMICONDUCTOR LASER OPERATING CIRCUIT

[75] Inventors: Masakazu Murase; Takashi Shoji, both of Kanagawa, Japan

[73] Assignee: Fuji Photo Film Co., Ltd., Kanagawa, Japan

[21] Appl. No.: 475,546

[22] Filed: Feb. 6, 1990

[30] Foreign Application Priority Data

Feb. 10, 1989 [JP] Japan ................................. 1-32168

[51] Int. Cl.$^5$ .............................................. H01S 3/13
[52] U.S. Cl. ...................................... 372/31; 372/29; 372/38
[58] Field of Search ............................ 372/29, 31, 38

[56] References Cited

U.S. PATENT DOCUMENTS

| 4,733,398 | 3/1988 | Shibagaki et al. | 372/31 |
| 4,796,267 | 1/1989 | Yamada et al. | 372/31 |
| 4,849,989 | 7/1989 | Shoji et al. | 372/29 |

Primary Examiner—James W. Davie
Attorney, Agent, or Firm—Sughrue, Mion, Zinn, Macpeak & Seas

[57] ABSTRACT

A semiconductor laser operating circuit comprises a signal limiting circuit which receives a beam intensity instructing signal, and limits values of the beam intensity instructing signal, which are larger than a predetermined value, to the predetermined value. A high-pass filter extracts high frequency components from the output of the signal limiting circuit. A monitor circuit detects the intensity of a laser beam produced by a semiconductor laser, and generates a signal representing the detected intensity. An adding and subtracting circuit adds the value of the output of the high-pass filter to the value of the beam intensity instructing signal, and calculates the difference between the value obtained from the addition and the value of the signal representing the detected intensity, which signal has been generated by the monitor circuit. The semiconductor laser is controlled by the output of the adding and subtracting circuit.

5 Claims, 5 Drawing Sheets

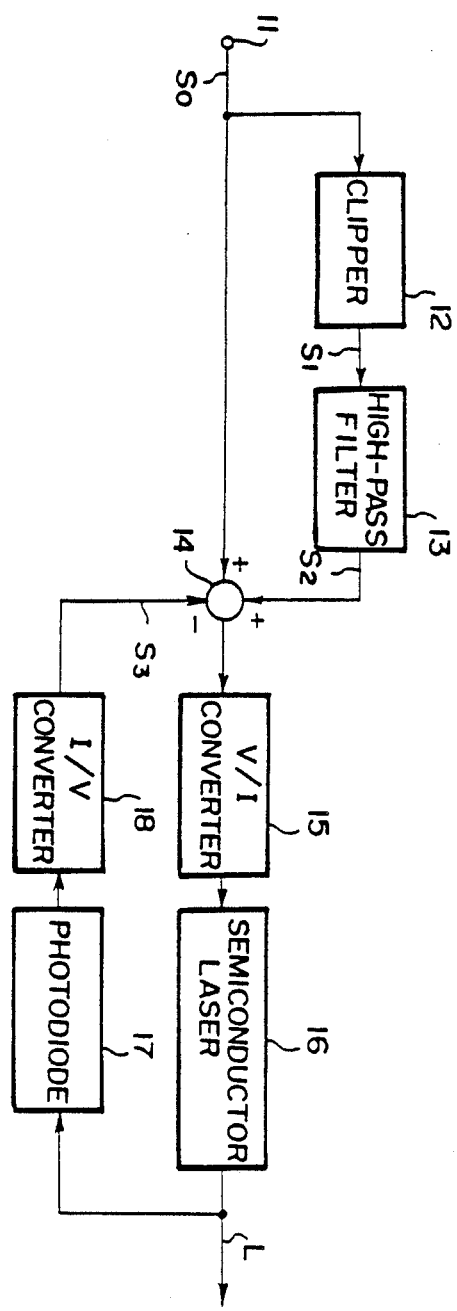
F I G. 1

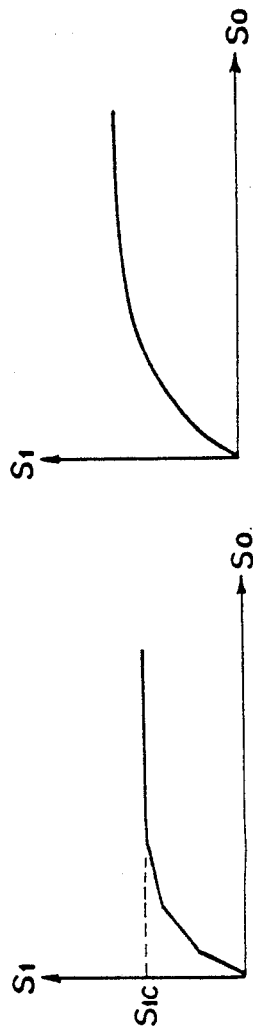
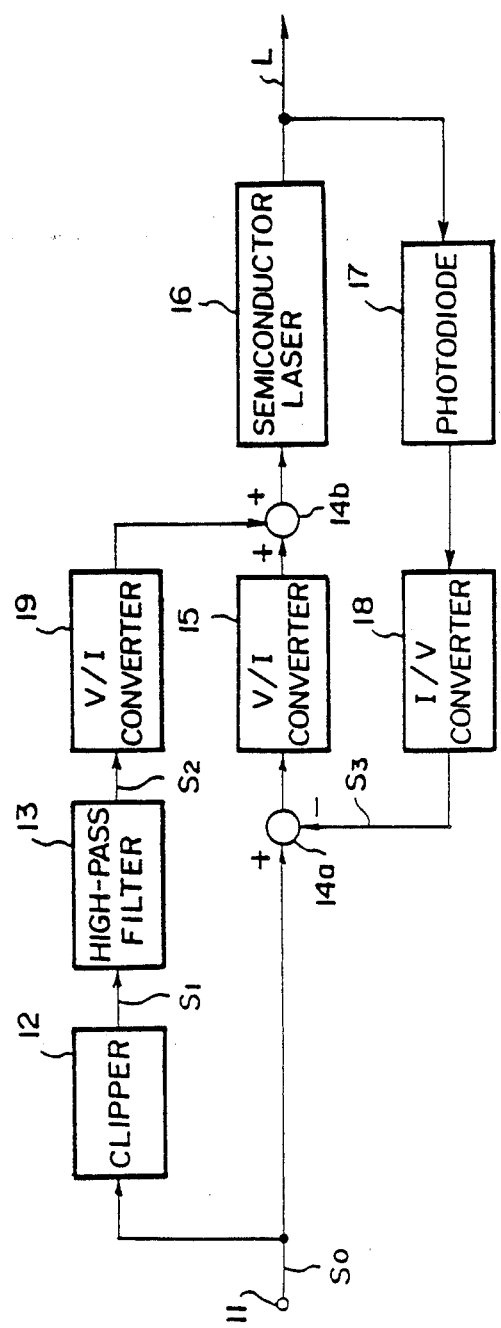
FIG. 7A FIG. 7B
FIG. 8

SEMICONDUCTOR LASER OPERATING CIRCUIT

BACKGROUND OF THE INVENTION

1. Field of the Invention

This invention relates to a circuit which controls a semiconductor laser used in a light beam scanning recording apparatus, an optical communication apparatus, or the like. This invention particularly relates to a circuit which controls a semiconductor laser so that the output power of the semiconductor laser can change quickly in response to a change in the value of a beam intensity instructing signal.

2. Description of the Prior Art

Light beam scanning recording apparatuses wherein a light beam is deflected by a light deflector, which causes it to scan a photosensitive recording material and record information on the photosensitive recording material, have heretofore been widely used. Also, optical communication apparatuses wherein optical signals are transmitted through optical fibers have been put into practice. As one of the means for producing a light beam in the light beam scanning recording apparatuses and the optical communication apparatuses, a semiconductor laser has heretofore been used. A semiconductor laser has various advantages in that it is small in size, cheap, and consumes little power, and in that the laser beam can be modulated directly by the drive current applied thereto.

In general, the circuit for operating a semiconductor laser is provided with an automatic power control circuit (hereinafter referred to as an APC circuit) which stabilizes the output power of the semiconductor laser so that the semiconductor laser produces a laser beam having an intensity accurately coinciding with the value designated by a beam intensity instructing signal. In the conventional APC circuit, the intensity of a laser beam radiated rearwardly from the semiconductor laser (i.e. a laser beam radiated in a direction reverse to the direction along which the forwardly radiated laser beam to be used for the recording of an image, or the like, is produced) is detected. Alternatively, the intensity of part of the forwardly radiated laser beam which has been separated from the main forwardly radiated laser beam by a semitransparent mirror, or the like, is detected. The drive current applied to the semiconductor laser is controlled so that the difference between the detected intensity and the intensity designated by the beam intensity instructing signal becomes zero.

However, the intensity of a laser beam radiated rearwardly from the semiconductor laser or the intensity of part of the forwardly radiated laser beam, which has been separated from the main forwardly radiated laser beam, is markedly lower than the intensity of the main laser beam which is radiated forwardly from the semiconductor laser. Therefore, the level of the feedback signal, which corresponds to the intensity detected from a laser beam radiated rearwardly from the semiconductor laser or the intensity of part of the forwardly radiated laser beam, will be too low. Since the feedback signal affects the beam intensity instructing signal, which stabilizes the output power of the semiconductor laser, and since its level is too low, it must be greatly amplified. However, when the feedback signal is amplified greatly, a large phase lag occurs in the control system for stabilizing the output power of the semiconductor laser due to, for example, the use of too many amplifiers, so that it becomes difficult to keep the band width through the feedback loop wide. Also, the speed, with which the output power of the semiconductor laser changes in response to a change in the value of the beam intensity instructing signal, drops. Additionally, in order to obtain a wide dynamic range in the output power of the semiconductor laser, it is necessary to utilize the output of the semiconductor laser which results from both comparatively small and large values of drive current. The output power of the semiconductor laser corresponding to the application of a comparatively small drive current thereto is low, and the speed with which the output power changes in response to a change in the value of the beam intensity instructing signal is low. Therefore, in cases where both comparatively small and large drive currents are applied to the semiconductor laser, a problem occurs in that the speed, with which the output power of the semiconductor laser changes in response to a change in the value of the beam intensity instructing signal, fluctuates in accordance with the level of the output power of the semiconductor laser.

If the speed with which the output power of the semiconductor laser changes in response to a change in the value of the beam intensity instructing signal is low in cases where, for example, the value of the beam intensity instructing signal changes step-wise, considerable time lags will occur before the change in the intensity of the laser beam produced by the semiconductor laser will follow the change in the value of the beam intensity instructing signal. Such time lags make it impossible to increase the operational speed of light beam scanning recording apparatuses, optical communication apparatuses, or the like.

Various means have been proposed in order to solve the problem which occurs because of the slow rate of change in the speed with which the output power of the semiconductor laser changes in response to a change in the value of the beam intensity instructing signal. By way of example, in U.S. Pat. No. 4,849,980, the applicant has proposed a technique wherein a beam intensity instructing signal which has passed through a lead-lag filter is used in order to stabilize the output power of a semiconductor laser. (this technique will hereinafter be referred to as conventional technique 1.) Further, in this U.S. Patent, the applicant has proposed a technique wherein a bias current is fed into a semiconductor laser. (This technique will hereinafter be referred to as conventional technique 2.)

However, conventional technique 1 has a problem in that, in cases where a wide dynamic range is required in the output power of the semiconductor laser, ringing occurs with the output power and the waveform of the output power becomes distorted when the level of the output power is high. With conventional technique 2, the speed with which the output power of the semiconductor laser changes in response to a change in the value of the beam intensity instructing signal can be kept high. However, conventional technique 2 has the drawback that the dynamic range of the output power of the semiconductor laser will become narrow depending on the level of the bias current. Accordingly, in cases where a wide dynamic range is required in the output power of the semiconductor laser, only a small bias current can be fed into the semiconductor laser, and therefore the operational speed of light beam scanning recording apparatuses, optical communication apparatuses, or the like, cannot be increased very much.

SUMMARY OF THE INVENTION

The primary object of the present invention is to provide a semiconductor laser operating circuit which controls a semiconductor laser so that the output power of the semiconductor laser will change quickly in response to a change in the value of a beam intensity instructing signal without the waveform of the output power being distorted due to overshooting, ringing, or the like.

Another object of the present invention is to provide a semiconductor laser operating circuit which controls a semiconductor laser so that the output power of the semiconductor laser will change quickly in response to a change in the value of a beam intensity instructing signal without the waveform of the output power being distorted due to overshooting, ringing, or the like, and so that the dynamic range of the output power of the semiconductor laser will be kept wide.

The present invention provides a semiconductor laser operating circuit, which receives a beam intensity instructing signal and controls a semiconductor laser and the intensity of a laser beam produced thereby, the semiconductor laser operating circuit comprising:
(i) a signal limiting circuit which receives said beam intensity instructing signal and limits values of said beam intensity instructing signal, which are larger than a predetermined value, to said predetermined value,
(ii) a high-pass filter which extracts high frequency components from the output of said signal limiting circuit,
(iii) a monitor circuit which detects the intensity of said laser beam, and generates a signal representing the detected intensity, and
(iv) an adding and subtracting circuit which adds the value of the output of said high-pass filter to the value of said beam intensity instructing signal, and calculates the difference between the value obtained from said addition and the value of said signal representing the detected intensity, which signal has been generated by said monitor circuit,
wherein said semiconductor laser is controlled by the output of said adding and subtracting circuit.

The semiconductor laser operating circuit in accordance with the present invention is provided with a high-pass filter, which emphasizes the amount of change in the value of the beam intensity instructing signal when the beam intensity instructing signal changes stepwise. Therefore, with the semiconductor laser operating circuit in accordance with the present invention, the output power of the semiconductor laser will change quickly in response to a change in the value of the beam intensity instructing signal. However, as described above, a semiconductor laser has the characteristic that the speed, with which the output power changes in response to a change in the value of the beam intensity instructing signal, is lower when the output power is low (i.e. when the value of the beam intensity instructing signal is small) than when the output power is high (i.e. when the value of the beam intensity instructing signal is large). Therefore, when the value of the beam intensity instructing signal is large, if the speed, with which the output power of the semiconductor laser changes in response to a change in the value of the beam intensity instructing signal, is increased in the same manner as when the value of the beam intensity instructing signal is small, the problem described below will occur. Specifically, in cases where the value of the beam intensity instructing signal is large and changes step-wise, overshooting and ringing occur, and the waveform of the output power of the semiconductor laser becomes distorted. In the semiconductor laser operating circuit in accordance with the present invention, in order for the waveform of the output power of the semiconductor laser not to be distorted by overshooting and ringing, a signal limiting circuit, such as a clipping circuit, which limits the values of the beam intensity instructing signal, to a predetermined value, is located in a stage of the circuit which comes before the high-pass filter. Therefore, with the semiconductor laser operating circuit in accordance with the present invention, the speed, with which the output power of the semiconductor laser changes in response to a change in the value of the beam intensity instructing signal, can be kept high when the output power is particularly low. Also, no distortion occurs in the waveform of the output power of the semiconductor laser when the output power is particularly high. Additionally, the dynamic range in the output power of the semiconductor laser can be kept wide. During the steady state wherein the value of the beam intensity instructing signal does not change, the monitor circuit enables the output power of the semiconductor laser to be kept stable.

As described above, the semiconductor laser operating circuit in accordance with the present invention comprises a signal limiting circuit, which receives the beam intensity instructing signal and limits values thereof, which are larger than a predetermined value, to the predetermined value, and a high-pass filter which extracts high frequency components from the output of the signal limiting circuit. The semiconductor laser operating circuit in accordance with the present invention also comprises the monitor circuit which detects the intensity of the laser beam produced by the semiconductor laser and generates a signal representing the detected intensity. An adding and subtracting circuit adds the value of the output of the high-pass filter to the value of the beam intensity instructing signal, and calculates the difference between the value obtained from said addition and the value of the signal representing the detected intensity, which signal has been generated by the monitor circuit. The output from the adding and subtracting circuit is used to control the semiconductor laser. Therefore, with the semiconductor laser operating circuit in accordance with the present invention, the output power of the semiconductor laser will change quickly in response to a change in the value of a beam intensity instructing signal without the waveform of the output power being distorted due to overshooting, ringing, or the like. Also, the dynamic range of the output power of the semiconductor laser can be kept wide.

BRIEF DESCRIPTION OF THE DRAWINGS

FIG. 1 is a block diagram showing an embodiment of the semiconductor laser operating circuit in accordance with the present invention, FIG. 8 is a block diagram showing another embodiment of the semiconductor laser operating circuit in accordance with the present invention.

DESCRIPTION OF THE PREFERRED EMBODIMENTS

The present invention will hereinbelow be described in further detail with reference to the accompanying drawings.

Figure 2:
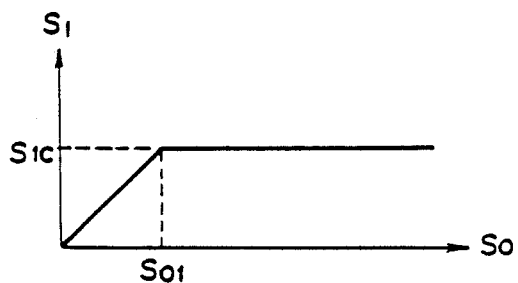
FIG. 2 is a graph showing input and output characteristics of a clipping circuit which serves as a signal limiting circuit and which is employed in the embodiment of FIG. 1, FIGS. 3A, 3B, 3C, and 3D are graphs showing examples of waveforms of signals at various parts of the embodiment shown in FIG. 1.

FIG. 1 is a block diagram showing an embodiment of the semiconductor laser operating circuit in accordance with the present invention. FIG. 2 is a graph of the transfer characteristics of a clipping circuit which serves as a signal limiting circuit and which is employed in the embodiment of FIG. 1. In FIG. 2, the values of a beam intensity instructing signal S0, which is fed into the clipping circuit, are plotted on the horizontal axis of the graph, and the values of an output signal S1 generated by the clipping circuit are plotted on the vertical axis.

An input terminal 11, which is shown at the left part of FIG. 1, is connected to a control computer (not shown), and receives the beam intensity instructing signal S0 from the control computer. The beam intensity instructing signal S0 is fed into an adding and subtracting circuit 14 and a clipping circuit 12. As shown in FIG. 2, when the value of the beam intensity instructing signal S0 is smaller than S01, the value of the output signal S1 generated by the clipping circuit 12 is proportional to the value of the beam intensity instructing signal S0. When the value of the beam intensity instructing signal S0 is larger than S01, the value of the output signal S1 generated by the clipping circuit 12 is limited to S1C. Reverting to FIG. 1, the output signal S1 from the clipping circuit 12 is fed into a high-ass filter 13. The high-pass filter 13 generates a differential signal S2, which is then fed into the adding and subtracting circuit 14. The output of the adding and subtracting circuit 14 is converted by a voltage-to-current converter 15 into a current signal (i.e. a drive current), and the drive current is fed into a semiconductor laser 16. The semiconductor laser 16 produces a laser beam L whose intensity corresponds to the level of the drive current. Part of the laser beam L is detected by a photodiode 17 which serves as a monitor circuit and which generates a current signal representing the intensity of the laser beam L. The current signal representing the intensity of the laser beam L is converted by a current-to-voltage converter 18 into a voltage signal (i.e. a monitor signal S3). The monitor signal S3 is fed into the adding the subtracting circuit 14. The adding and subtracting circuit 14 adds the value of the differential signal S2 to the value of the beam intensity instructing signal S0, and subtracts the value of the monitor signal S3 from the sum of the differential signal S2 and the beam intensity instructing signal S0. The adding and subtracting circuit 14 generates a voltage signal which represents the results of the calculation. In FIG. 1, amplifiers or the like, which will be used to adjust the levels of the signals, are not shown. However, the signals may be amplified in the respective circuits, when necessary.

FIGS. 3A, 3B, 3C, and 3D are graphs showing examples of waveforms of the signals at various parts of the embodiment shown in FIG. 1.

Figure 3A:
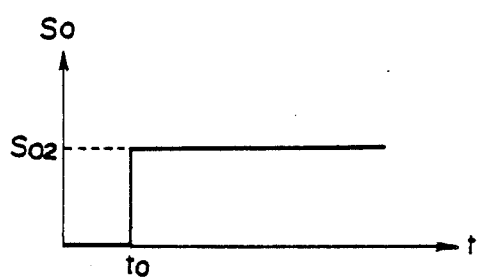

FIG. 3A shows the waveform of the beam intensity instructing signal S0 received from the control computer. The value of the beam intensity instructing signal S0 is zero up to the time t0, and increases stepwise to a value S02 at the time t0.

Figure 3C:
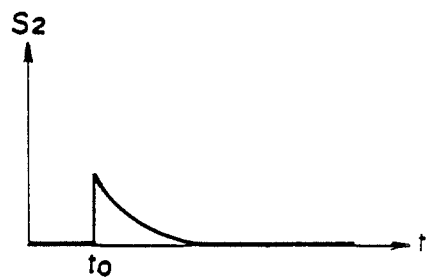
Figure 3B:
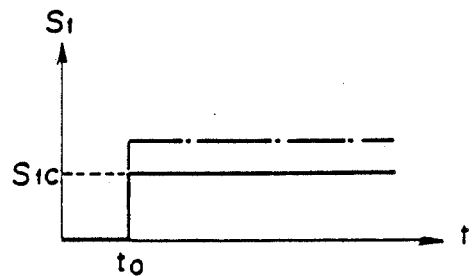

In FIG. 3B, the solid line indicates the waveform of the output signal S1 of the clipping circuit 12. The chained line indicates the waveform of the output signal S1 which would have teen obtained if the beam intensity instructing signal S0 had not been clipped. Before the time t0, as the value of the beam intensity instructing signal S0 is zero, the value of the output signal S1 is also zero. At the time t0, the value of the output signal S1 increases to the clipping reference voltage S1C. The value of the output signal S1 is limited to the clipping reference voltage S1C. This action limits the value of the differential signal S2, which is generated by the high-pass filter 13, to a certain value in cases where the value of the beam intensity instructing signal S0 increases (or decreases) markedly, or in cases where the value of the beam intensity instructing signal S0 increases (or decreases) when the output power of the semiconductor laser 16 is high (i.e. when the value of the beam intensity instructing signal S0 is large).

FIG. 3C shows the waveform of the differential signal S2 which is obtained from the high-pass filter 13. The differential signal S2 is pulse-like and rises at the time t0.

Figure 3D:
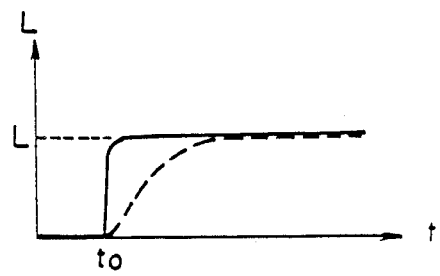

In FIG. 3D, the solid line indicates the waveform of the intensity of the laser beam L. The broken line indicates the waveform of the intensity of the laser beam L which would have been obtained because of a slow response speed if the output terminal of the high-pass filter 13 had been grounded so that no differential signal S2 could be fed out of the high-pass filter 13. Because the clipping circuit 12 and the high-pass filter 13 are present, the speed, with which the intensity of the laser beam L produced by the semiconductor laser 16 changes in response to a change in the value of the beam intensity instructing signal S0, becomes high.

With this embodiment, the clipping reference voltage S1C in the clipping circuit 12 and the frequency characteristics (time constant for differentiation) of the high-pass filter 13 have been set to appropriate values. Therefore, the speed, with which the output power of the semiconductor laser 16 will change in response to a change in the value of the beam intensity instructing signal S0, can be kept high without the waveform of the output power being distorted due to overshooting, ringing, or the like, when the value of the beam intensity instructing signal S0 changes step-wise. Also, with this embodiment, no limitation is imposed on the dynamic range of the output power of the semiconductor laser 16.

Figure 4:
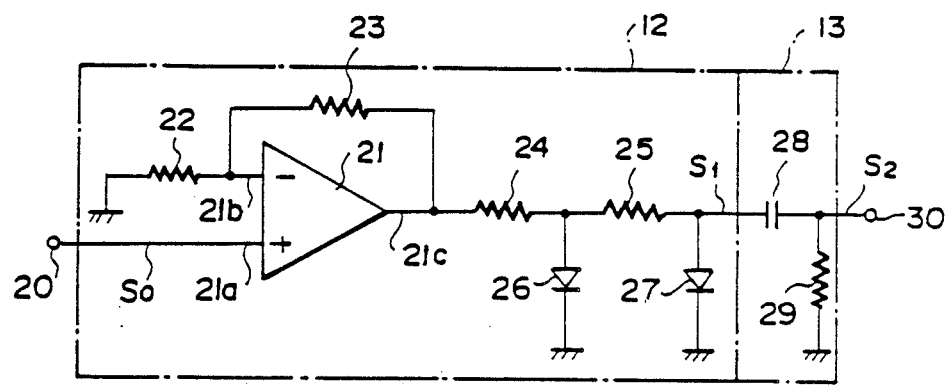
FIG. 4 is a circuit diagram showing an example of a clipping circuit and a high-pass filter employed in the embodiment of FIG. 1.

FIG. 4 is a circuit diagram showing an example of the clipping circuit 12 and the high-pass filter 13 employed in the embodiment of FIG. 1.

With reference to FIG. 4, an input terminal 20 is connected to the input terminal 11 shown in FIG. 1, and the beam intensity instructing signal S0 is fed through the input terminal 20 into the clipping circuit 12. The input terminal 20 is connected to the noninverting terminal 21a of an operational amplifier 21. The inverting terminal 21b of the operational amplifier 21 is grounded via a resistor 22. Also, the inverting terminal 21b is connected to the output terminal 21c of the operational amplifier 21 via a resistor 23. The operational amplifier 21 serves both as a voltage follower for the beam intensity instructing signal S0 and as an amplifier for appropriately amplifying the beam intensity instructing signal S0. The output terminal 21c of the operational amplifier 21 is connected to one side of a resistor 24. The other side of the resistor 24 is connected to one side of a resistor 25 and the anode of a diode 26. The cathode of the diode 26 is grounded. The other side of the resistor 25 is connected to the anode of a diode 27. The cathode of the diode 27 is grounded. When the signal fed out of the operational amplifier 21 exceeds a predetermined voltage, the combination of the resistors 24 and 25 and the diodes 26 and 27 limits the signal to the predetermined voltage, i.e. to the forward drop-away voltage of the diodes 26 and 27. In this example, the clipping circuit 12 is composed of the operational amplifier 21, the resistors 22 and 23, and the clipping means (i.e. the combination of the resistors 24 and 25, and the diodes 26 and 27).

To the node, to which the other side of the resistor 25 and the anode of the diode 27 are connected, one terminal of a capacitor 28 is connected. The other terminal of the capacitor 28 is connected to an output terminal 30 of the high-pass filter 13. The output terminal 30 is grounded via a resistor 29. The capacitor 28 and the resistor 29 constitute the high-pass filter 13 (i.e. the differential circuit). The differential signal S2 is fed out of the output terminal 30.

The clipping circuit 12 and the high-pass filter 13 have the configurations described above. The adding and subtracting circuit 14, the voltage-to-current converter 15, the semiconductor laser 16, the photodiode 17, and the current-to-voltage converter 18 shown in FIG. 1 may be any of known types.

Figure 5:
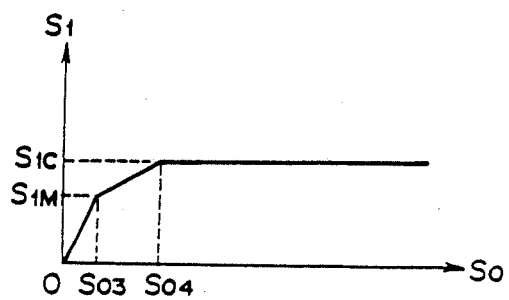
FIG. 5 is a graph showing the input-output transfer characteristics of another example of a signal limiting circuit which may be employed in the semiconductor laser operating circuit in accordance with the present invention.

FIG. 5 is a graph showing the transfer characteristics of another example of a signal limiting circuit which may be employed in the semiconductor laser operating circuit in accordance with the present invention.

With reference to FIG. 5, the signal limiting circuit has the characteristic that, when the value of the beam intensity instructing signal S0 is smaller than S03 (i.e. when the value of the output signal S1 of the signal limiting circuit is smaller than S1M), the amplification factor is large. When the value of the beam intensity instructing signal S0 falls within the range of S03 to S04, the amplification factor is small. When the value of the beam intensity instructing signal S0 is larger than S04, the value of the output signal S1 of the signal limiting circuit is fixed at S1C. In cases where a signal limiting circuit having such transfer characteristics is used, a differential signal S2 having a larger value than the value corresponding to a change in the value of the beam intensity instructing signal S0 can be obtained when the output power of the semiconductor laser 16 is low, at which times the speed, with which the output power of the semiconductor laser 16 changes in response to a change in the value of the beam intensity instructing signal S0, will be slow. Therefore, the speed, with which the output power of the semiconductor laser 16 will change in response to a change in the value of the beam intensity instructing signal S0, can be more reliably kept high. Also, a clipping reference voltage S1C is also set in this signal limiting circuit, and therefore the waveform of the output power of the semiconductor laser 16 will not become distorted due to overshooting, ringing, or the like, when the value of the beam intensity instructing signal S0 is comparatively large and changes step-wise.

Figure 6:
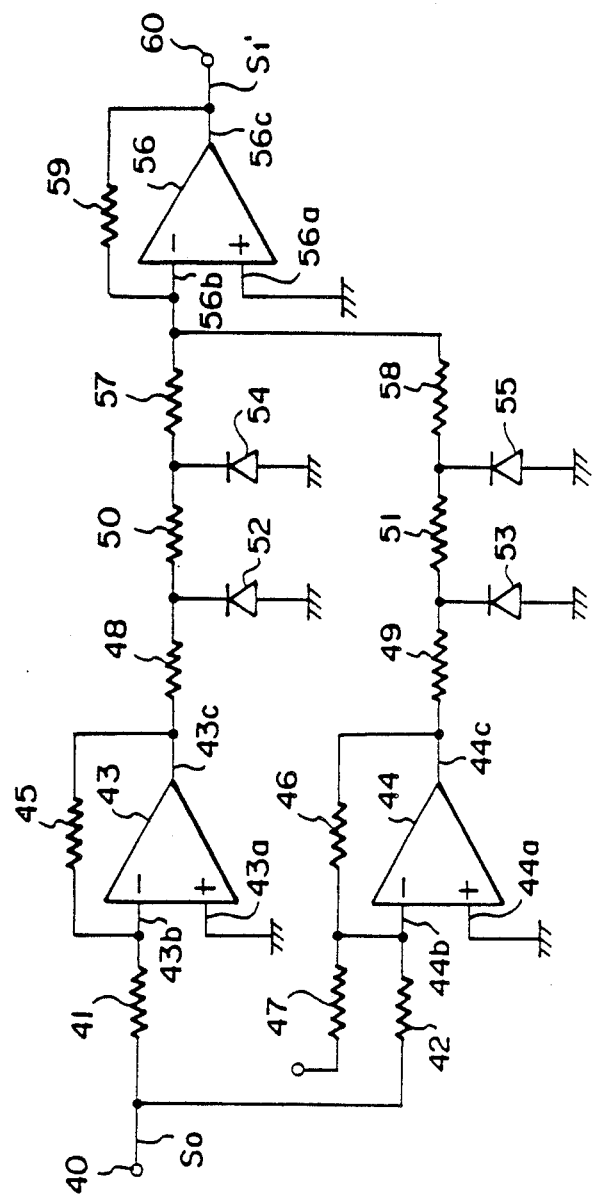
FIG. 6 is a circuit diagram showing a signal limiting circuit which has the input-output transfer characteristics shown in FIG. 5, FIGS. 7A and 7B are graphs showing various examples of input-output transfer characteristics for signal limiting circuits which may be employed in the semiconductor laser operating circuit in accordance with the present invention.

FIG. 6 is a circuit diagram showing the signal limiting circuit which exhibits the transfer characteristics shown in FIG. 5.

The signal limiting circuit shown in FIG. 6 is used in lieu of the clipping circuit 12 shown in FIGS. 1 and 2.

With reference to FIG. 6, an input terminal 40 is connected to the input terminal 11 shown in FIG. 1, and the beam intensity instructing signal S0 is fed through the input terminal 40 into the signal limiting circuit. The input terminal 40 is connected to the inverting terminal 43b of an operational amplifier 43 via a resistor 41. The input terminal 40 is also connected to the inverting terminal 44b of an operational amplifier 44 via a resistor 42. The noninverting terminal 43a of the operational amplifier 43 and the noninverting terminal 44a of the operational amplifier 44 are grounded. The inverting terminal 43b of the operational amplifier 43 is connected to an output terminal 43c of the operational amplifier 43 via a resistor 45. The inverting terminal 44b of the operational amplifier 44 is connected to an output terminal 44c of the operational amplifier 44 via a resistor 46. Also, one side of a resistor 47 is connected to the inverting terminal 44b of the operational amplifier 44. Also bias S03 (shown in FIG. 5) is fed into the inverting terminal 44b of the operational amplifier 44 via the resistor 47.

The output terminal 43c of the operational amplifier 43 is connected to one side of a resistor 48. The other side of the resistor 48 is connected to one side of a resistor 50 and the cathode of a diode 52. The anode of the diode 52 is grounded. The other side of the resistor 50 is connected to the cathode of a diode 54. The anode of the diode 54 is grounded. A resistor 57 is located between the cathode of the diode 54 and the inverting terminal 56b of an operational amplifier 56. Also, the output terminal 44c of the operational amplifier 44 is connected to one side of a resistor 49. The other side of the resistor 49 is connected to one side of a resistor 51 and the cathode of a diode 53. The anode of the diode 53 is grounded. The other side of the resistor 51 is connected to the cathode of a diode 55. The anode of the diode 55 is grounded. A resistor 58 is connected between the cathode of the diode 55 and the inverting terminal 56b of the operational amplifier 56. The noninverting terminal 56a of the operational amplifier 56 is grounded. A resistor 59 is connected between the inverting terminal 56b and an output terminal 56c of the operational amplifier 56. The output terminal 56c of the operational amplifier 56 is connected to an output terminal 60 of the signal limiting circuit.

When the beam intensity instructing signal S0 is fed through the input terminal 40 into the signal limiting circuit shown in FIG. 6, the beam intensity instructing signal S0 is amplified by the operational amplifier 43. Also, the operational amplifier 44 adds the value of the beam intensity instructing signal S0 to the value of the bias S03, and amplifies the value obtained from the addition. The outputs obtained from the operational amplifiers 43 and 44 are clipped, and the outputs resulting from the clipping processes are added together by the operational amplifier 56. An output signal S1' generated by the operational amplifier 56 differs from the output signal S1 shown in FIG. 5 in that the direct current components have been superposed. However, the direct current components are removed by the high-pass filter 13 shown in FIGS. 1 and 4, which filter is located immediately after the signal limiting circuit. Therefore, no problem occurs. When the signal limiting circuit shown in FIG. 6 is used, the speed, with which the output power of the semiconductor laser 16 changes in response to a change in the value of the beam intensity instructing signal S0, can be kept high in accordance with the level of the output power.

The signal limiting circuit employed in the semiconductor laser operating circuit in accordance with the present invention is not limited to the circuits shown in FIGS. 4 and 6.

FIGS. 7A and 7B are graphs showing various examples of transfer characteristics for signal limiting circuits which may be employed in the semiconductor laser operating circuit in accordance with the present invention.

In the example of FIG. 7A, the amplification factor is changed in three steps before the output signal S1 reaches the clipping reference voltage S1C. As the number of steps in which the amplification factor is changed is increased, the speed, with which the output power of the semiconductor laser changes in response to a change in the value of the beam intensity instructing signal, can be controlled more and more finely.

In the example of FIG. 7B, no specific clipping reference voltage is set. In the illustrated transfer characteristics, the value of the output signal S1 increases more and more gradually as the value of the input signal (i.e. the beam intensity instructing signal S0) becomes larger. The inclination of the curve of the transfer characteristics decreases gradually as the value of the beam intensity instructing signal S0 becomes larger. Therefore, the same effects can be obtained as with a clipping reference voltage. As described above with reference to FIGS. 2, 5, 7A, and 7B, one of several signal limiting circuits having various transfer characteristics may be employed in the semiconductor laser operating circuit in accordance with the present invention.

The circuit configuration of the high-pass filter 13 is not limited to that shown in FIG. 2, and any of known filters may be employed in the semiconductor laser operating circuit in accordance with the present invention.

FIG. 8 is a block diagram showing another embodiment of the semiconductor laser operating circuit in accordance with the present invention. In FIG. 8, similar elements are numbered with the same reference numerals with respect to FIG. 1.

With reference to FIG. 8, the semiconductor laser operating circuit is provided with a subtracting circuit 14a which calculates the difference between the value of the beam intensity instructing signal S0 and the value of the monitor signal S3. The semiconductor laser operating circuit is also provided with a voltage-to-current converter 19 which converts the differential signal S2 into a current signal, and an adding circuit 14b which adds the value of the current signal generated by the voltage-to-current converter 19 to the value of a current signal obtained from the voltage-to-current conversion of the output of the subtracting circuit 14a. In this embodiment, the adding and subtracting circuit is constituted of the subtracting circuit 14a, the adding circuit 14b, and the voltage-to-current converters 15 and 19.

We claim:

1. A semiconductor laser operating circuit, which receives a beam intensity instructing signal and controls a semiconductor laser and the intensity of a laser beam produced thereby, the semiconductor laser operating circuit comprising:
(i) a signal limiting circuit which receives said beam intensity instructing signal and limits values of said beam intensity instructing signal, which are larger than a predetermined value, to said predetermined value,
(ii) a high-pass filter which extracts high frequency components from the output of said signal limiting circuit,
(iii) a monitor circuit which detects the intensity of said laser beam, and generates a signal representing the detected intensity, and
(iv) an adding and subtracting circuit which adds the value of the output of said high-pass filter to the value of said beam intensity instructing signal, and calculates the difference between the value obtained from said addition and the value of said signal representing the detected intensity, which signal has been generated by said monitor circuit,
wherein said semiconductor laser is controlled by the output of said adding and subtracting circuit.

2. A semiconductor laser operating circuit as defined in claim 1 wherein said signal limiting circuit is a clipping circuit which generates an output signal having a value proportional to the value of said beam intensity instructing signal when the value of said beam intensity instructing signal fed into said clipping circuit is smaller than a predetermined value, and which generates an output signal having a value limited to a clipping reference value when the value of said beam intensity instructing signal fed into said clipping circuit is larger than the predetermined value.

3. A semiconductor laser operating circuit as defined in Claim 1 wherein said signal limiting circuit exhibits input-output transfer characteristics such that the amplification factor for said team intensity instructing signal is changed in a plurality of steps in accordance with the value of said team intensity instructing signal fed into said signal limiting circuit when the value of said beam intensity instructing signal fed into said clipping circuit is smaller than a predetermined value, and the value of an output signal generated by said signal limiting circuit is limited to a clipping reference value when the value of said beam intensity instructing signal fed into said signal limiting circuit is larger than the predetermined value.

4. A semiconductor laser operating circuit as defined in claim 1 wherein said signal limiting circuit exhibits input-output transfer characteristics such that the value of the output signal from said signal limiting circuit increases gradually as the value of said beam intensity instructing signal becomes larger, and the inclination of the curve representing the transfer characteristics decreases gradually as the value of said beam intensity instructing signal becomes larger.

5. A semiconductor laser operating circuit as defined in claim 1 wherein said monitor circuit comprises a photodiode.

* * * * *